(12) United States Patent
Sriram et al.

(10) Patent No.: US 6,519,751 B2
(45) Date of Patent: *Feb. 11, 2003

(54) METHOD AND APPARATUS FOR ACCURATE CROSSPOINT ALLOCATION IN VLSI AREA ROUTING

(75) Inventors: Mysore Sriram, San Jose; May Huang, Milpitas, both of CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/539,978

(22) Filed: Mar. 31, 2000

(65) Prior Publication Data

US 2002/0170029 A1 Nov. 14, 2002

(51) Int. Cl.[7] .............................................. G06F 17/50
(52) U.S. Cl. .......................................... 716/13; 716/10
(58) Field of Search ............................ 716/1–21; 703/2

(56) References Cited

U.S. PATENT DOCUMENTS

| | | | | |
|---|---|---|---|---|
| 4,484,292 A | * | 11/1984 | Hong et al. | 716/12 |
| 4,615,011 A | * | 9/1986 | Linsker | 716/13 |
| 5,495,419 A | * | 2/1996 | Rostoker et al. | 700/121 |
| 5,841,673 A | * | 11/1998 | Kobayashi et al. | 716/6 |
| 6,295,634 B1 | * | 9/2001 | Matsumoto | 716/12 |

OTHER PUBLICATIONS

Helvig et al. ("Improved approximation bounds for the group Seiner problem", Proceedings of Design, Automation and Test in Europe, Feb. 23, 1998, pp. 406–413).*
Cong et al. ("Performance–driven routing with multiple sources", IEEE Transactions on Computer–Aided Design of Integrated Circuits and Systems, vol. 16, No. 4, Apr. 1997, pp. 410–419).*
NA9002469 ("Partitioning Logic On to Graph Structures", IBM Technical Disclosure Bulletin, vol. 32, No. 9A, Feb. 1, 1990, pp. 469–475 ( pages)).*
NB9001129 ("New Algorithm for Stable Rectilinear Seiner Trees", IBM Technical Disclosure Bulletin, vol. 32, No. 8B. Jan. 1990, pp. 129–132 (6 pages)).*
NA83045571 ("Procedure for Connecting N Points with Near Minimum Cost", IBM Technical Disclosure Bulletin, vol. 25, No. 11A, Apr. 1983, pp. 5571–5575 (7 pages)).*
NA78308929 ("Chip Model With Wiring Cost Map", IBM Technical Disclosure Bulletin, vol. 26, No. 3A, Aug. 1983, pp. 929–933 (7 pages)).*
NA8909315 ("Generalization of Min–Cut Partitioning to Tree Structures", IBM Techical Disclosure Bulletin, vol. 32, No. 4A, Sep. 1989, pp. 315–322 (10 pages)).*

* cited by examiner

Primary Examiner—Vuthe Siek
Assistant Examiner—Phallaka Kik
(74) Attorney, Agent, or Firm—Blakely, Sokoloff, Taylor & Zafman LLP

(57) ABSTRACT

In one embodiment the invention is a method. The method includes finding costs to route a net to a set of crosspoints on a boundary. The method also includes propagating the costs to a succeeding set of nodes.

26 Claims, 6 Drawing Sheets

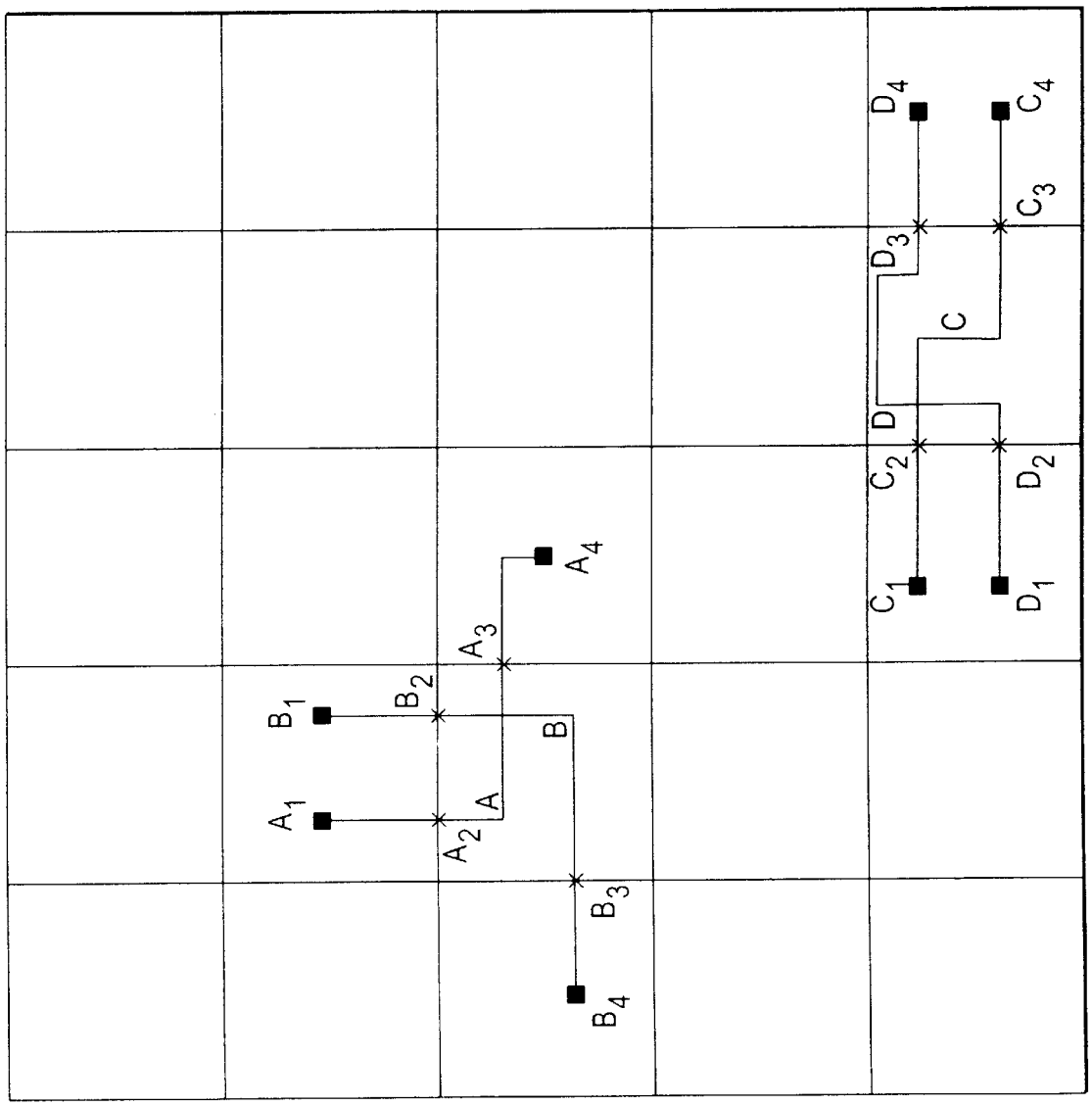

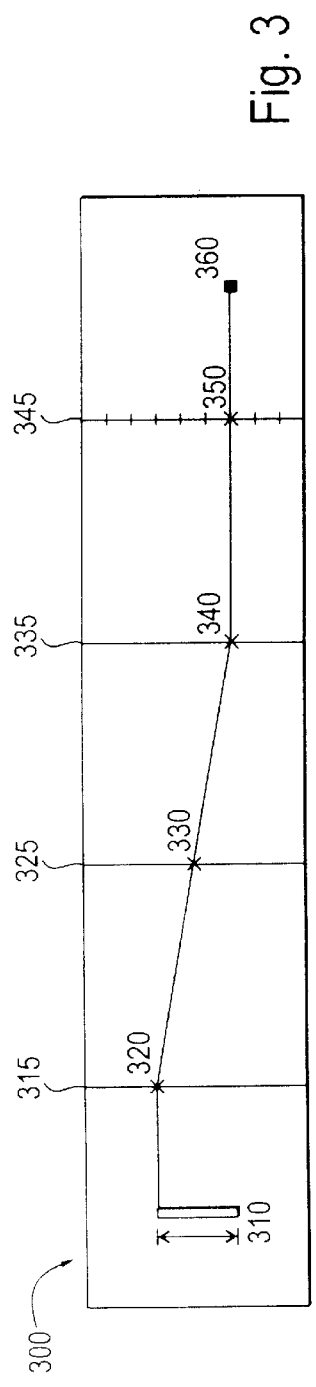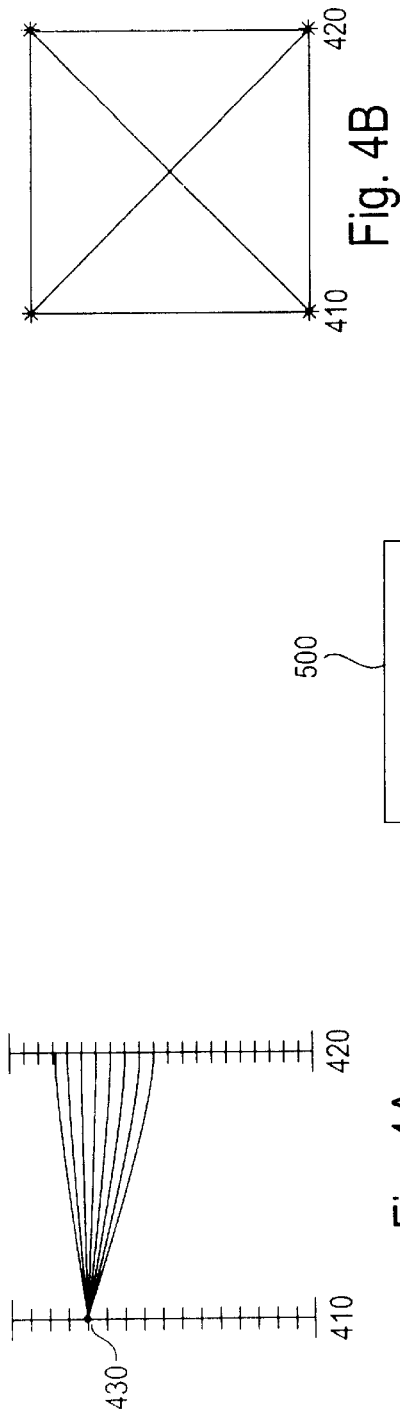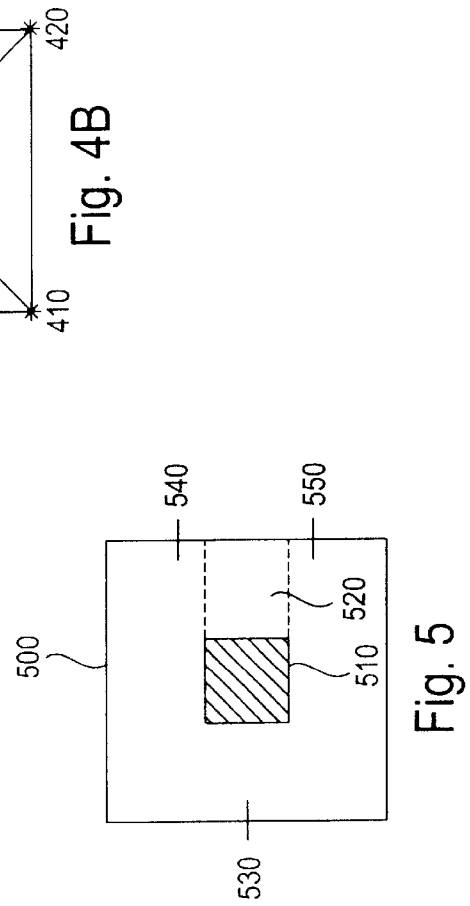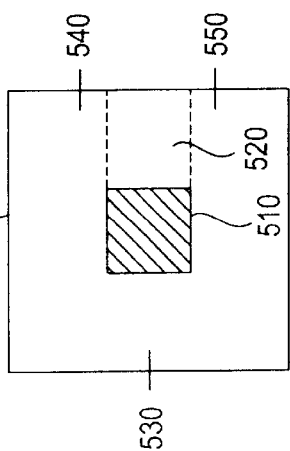

METHOD AND APPARATUS FOR ACCURATE CROSSPOINT ALLOCATION IN VLSI AREA ROUTING

BACKGROUND OF THE INVENTION

1. Field of the Invention

The invention generally relates to design and layout of integrated circuits and more specifically relates to automatic placement and routing of signals on VLSI semiconductors and the software for performing such placement and routing.

2. Description of the Related Art

Routing signals (conductors) on integrated circuits from sources to destinations or between multiple drivers and receivers is vital to the design and production of integrated circuits. As the density of circuitry on an integrated circuit increases, the number of these signals tends to increase, thus making routing of the signals more complex. Additionally, the wider and widening data busses tend to result in increasing numbers of signals that must be routed to have similar delays as a group.

In semiconductors, horizontal signal legs often are routed in a first layer of conductor (metal or polysilicon for example) and vertical signal legs are often routed in a second layer of conductor. The horizontal and vertical signal legs are alternated for succeeding layers of conductors (up to the seven or eight layers that may currently be available). An alternative method of routing uses conductors that actually "bend" or are used for both horizontal and vertical legs of a signal.

Furthermore, a common approach to routing involves attempting a general global routing of signals across a device, resulting in assignment of signals to a path through a set of regions. Then, routing of each region of the device occurs, wherein routing of the signals within each region is subject to constraints resulting from the global routing, and signals routed through multiple regions must be routed such that there are no discontinuities at region boundaries.

FIG. 1 illustrates two of the problems commonly found when attempting to route signals on an integrated circuit. The signals enter or exit the regions at crosspoints, the points or vertices on the boundary of the region through which the signal passes. Note that these points or vertices are not geometrically ideal, they have a width fixed by the design limitations of the integrated circuit and the process by which it is manufactured. Likewise, the crosspoints require a minimum spacing that also comes from the same design limitations of the integrated circuit and the process by which it is manufactured. The integrated circuit is divided up into regions through which signals are routed, as illustrated by the grid pattern.

The first problem illustrated is an L-shaped crossover, in which two signals are routed such that portions of the two signals are routed close to each other or even overlap. Signal A is routed from terminator A1 to terminator A4. Along the route, signal A enters a first area at crosspoint A2 and leaves the first area at crosspoint A3. Signal B is routed from terminator B1 to terminator B4. Signal B is also routed through a first area, entering at crosspoint B2 and leaving at crosspoint B3. (It will be appreciated that the conventions of entering and leaving are used for ease of illustration, and that the conductors or signals allow for flow of electrons or information in any direction between terminators on the signal.) As is apparent from the illustration, terminator B4 and terminator A4 are nearly at the same location in terms of the horizontal axis of the integrated circuit. As a result, crosspoint A3 and crosspoint B3 are nearly connectable by a straight line parallel to the edge of the semiconductor, and thus signal A and signal B nearly overlap in the region where they are made up of horizontal signal legs. If these two horizontal signal legs are routed in the same conductor (for example the first metal layer of a silicon semiconductor), they will be nearly impossible to route because each separate leg within a layer must be separated by a minimum distance determined by the manufacturing process. Furthermore, even this minimum distance may be insufficient, as crosstalk between the signal legs may result in unacceptable noise on the two signal lines.

The second problem illustrated in FIG. 1 is an X overlap between two signals. Signal C is routed from terminator C1 to terminator C4. Signal C enters a second area at crosspoint C2 and leaves the second area at crosspoint C3. Signal D is routed from terminator D1 to terminator D4. Signal D also traverses the second area, entering at crosspoint D2 and leaving at crosspoint D3. As will be appreciated, terminator C1 and terminator D4 are essentially lined up on a line parallel to the edge of the semiconductor, as are terminator D1 and terminator C4. As a result, signal C and signal D must cross at some point to achieve a reasonably short routing between the terminators for each signal. An actual diagonal crossing as illustrated here is likely to result in one of the signals being nearly unroutable or actually unroutable, since it would be nearly impossible to avoid some sort of overlap. Furthermore, diagonally routed signals in a design which primarily uses horizontal or vertical signals tend to effectively foreclose large areas of the integrated circuit from use for other signals relative to the signals actually routed therein.

SUMMARY OF THE INVENTION

In one embodiment the invention is a method. The method includes finding costs to route a net to a set of crosspoints on a boundary. The method also includes propagating the costs to a succeeding set of nodes.

BRIEF DESCRIPTION OF THE DRAWINGS

The present invention is illustrated by way of example and not limitation in the accompanying figures.

FIG. 2 illustrates a better solution to routing signals on a semiconductor under the conditions of FIG. 1.

FIG. 3 illustrates routing of a signal along various crosspoints from a terminator in one area to a terminator in another area.

FIG. 4A illustrates a plurality of paths from a vertex on a first boundary to a plurality of vertices on a second boundary.

FIG. 4B illustrates a starting point of two vertices on a first boundary, two vertices on a second boundary, and potential paths therebetween.

FIG. 5 illustrates an obstacle in an area and its corresponding shadow to routing in one direction through the area.

DETAILED DESCRIPTION

Figure 1:
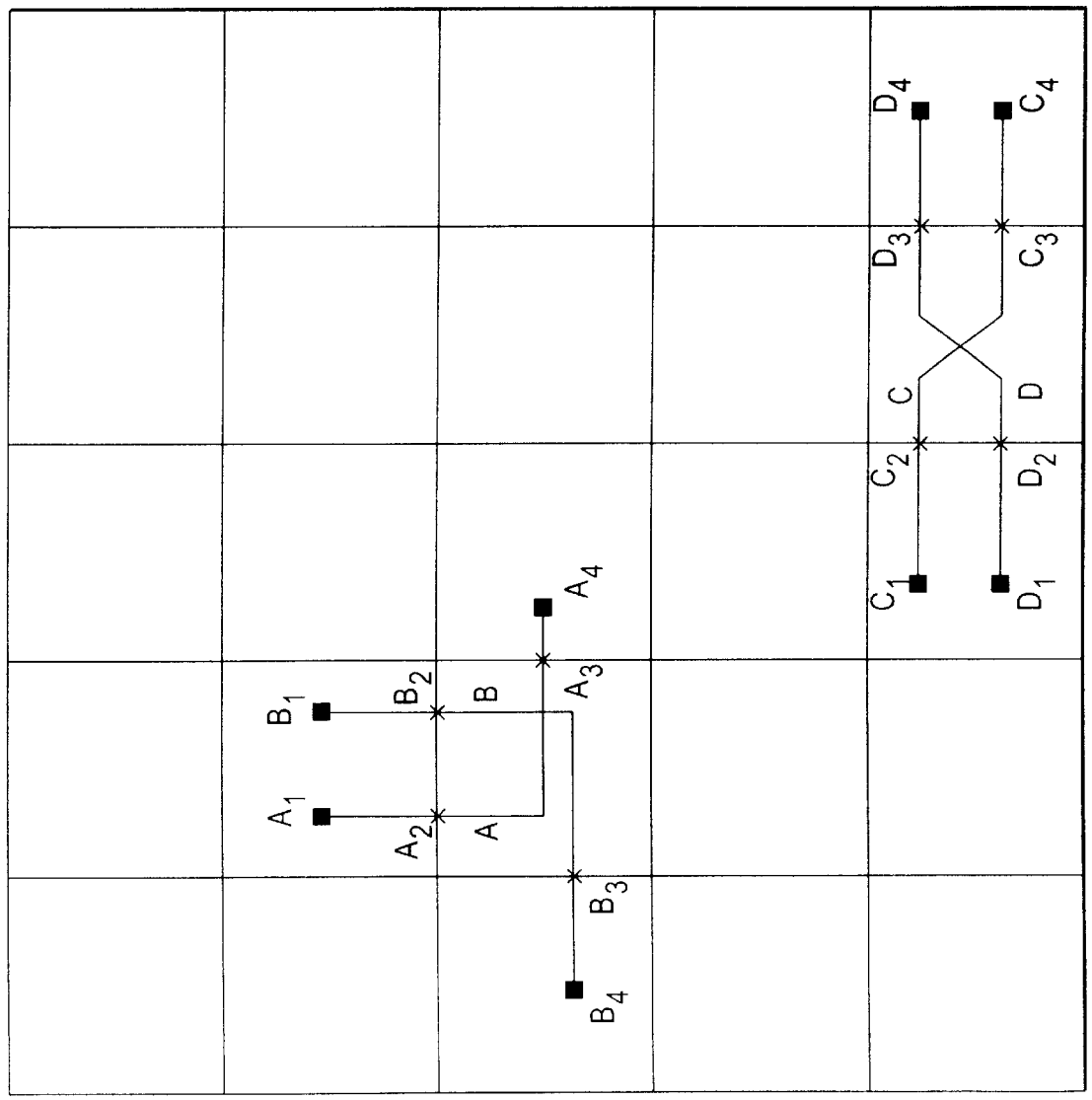
FIG. 1 illustrates two problems with routing signals on a semiconductor.

A method and apparatus for accurate crosspoint allocation in VLSI area routing is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments.

More efficient routing of signals on VLSI circuits may be achieved by utilizing techniques including the following three features. First, routing of the nets should be formulated as a minimum-cost path search. Second, an efficient technique for finding a minimum-cost path should be used. Third, a cost function suitable for simultaneously minimizing jogs, L-overlaps, and X-overlaps should be used.

Jogs in a signal route (portions of the path which go beyond the shortest suitable route) use extra space on an integrated circuit and increase the delay time for signals traveling that route. Therefore, avoiding jogs is advantageous. As mentioned previously, similar issues arise with respect to L-overlaps and X-overlaps. To the extent that routing of signals includes jogs, L-overlaps and X-overlaps, completion of the routing of all signals on an integrated circuit may be defeated, automatic routers may conclude that a routing of the integrated circuit as designed is not possible.

Routing is typically performed in a top-down manner. Routing of signals in a global or high-level manner occurs first, resulting in a signal being designated to travel through a certain set of areas of the integrated circuit, such as certain designated blocks within a grid of areas. Typically, the high-level routing will designate the crosspoints each signal will use when it is routed from one area to the next. Next, the signal is routed through each of these areas at a lower-level, resulting in a route through each area. This lower-level route works within the constraints imposed by the designation of crosspoints at the higher level. It is at this lower-level routing that problems with the high-level routing may make completion of routing impossible. If the high-level routing has too many signals to be routed through a particular area, the area may not have resources sufficient to allow for routing of all of the signals. Furthermore, if the high-level routing results in too many jogs, L-overlaps, or X-overlaps, the lower-level routing may not be possible to complete.

Utilizing the techniques described below, one embodiment has achieved a reduction in jogs of 50%, a reduction in L-overlaps of 40%, a reduction in X-overlaps of 70%, and an increase in routing completion of 10% over a prior art embodiment that did not use these techniques.

Turning to FIG. 2, a more preferred routing of the signals illustrated in FIG. 1 is illustrated. With regard to the routing of signals A and B, the crosspoint A3 has been adjusted to allow for a routing of the two signals with less overlap. The two signals still use approximately the same resources, but the overlap is reduced. With respect to signals C and D, the path of signal D within the second area has been altered to include a small jog. While jogs are undesirable, a small jog may be preferable to an X-overlap, and may therefore be incorporated.

To achieve the routing illustrated in FIG. 2 and in later figures, in one embodiment, routing is performed on a layer-by-layer basis. Likewise, a first layer is used for signal legs routed horizontally and a second layer is used for signal legs routed vertically (and this may be repeated in alternating fashion for additional layers of conductors). Within each layer, routing is performed on a row-by-row or column-by-column basis, wherein each row or column of the grid is routed independently, in a sequential fashion, with routing of later rows and columns dependent on results of routing earlier rows and columns.

Turning to FIG. 3, routing of a signal through a number of areas in a single horizontal row is illustrated. Row 300 is a row of five areas. The first area contains terminator 310, the area on the integrated circuit where the signal terminates at one end. In one embodiment, the signal originates at terminator 310 and terminates at terminator 360, but it will be appreciated that this in no way restricts the electrical function of either terminator 310 or terminator 360. The boundary between the first area and the second area is boundary 315. The boundary between the second area and the third area is boundary 325. The boundary between the third area and the fourth area is boundary 335. The boundary between the fourth area and the fifth area is boundary 345. The fifth area includes terminator 360, the terminator at the other end of the signal.

At each of boundaries 315, 325, 335 and 345, vertices or crosspoints are designated through which the signal may be routed. First, the signal is checked to see what the cost would be to route it through various crosspoints on boundary 315. Next, the signal is checked to see what the cost would be to route it through various crosspoints on boundary 325, including the cost of routing through the lowest-cost route through boundary 315 to each crosspoint on boundary 325. Thus, the cost of routing is propagated from one crosspoint to the next along the proposed route. A similar process occurs for routing through crosspoints on boundary 335 and through crosspoints on boundary 345.

In one instance, crosspoint 350 on boundary 345 is found to have the lowest cost to route to terminator 360 from terminator 310. Each crosspoint on the previous boundaries that led to that lowest cost for crosspoint 350 is then investigated, and a choice between any group of crosspoints on the previous boundary with the same cost is made. In this same instance, crosspoint 340 is found to have contributed to the lowest-cost route for crosspoint 350, so it is used for the route. This back-propagation is similarly used to choose crosspoint 330 and crosspoint 320, and the corresponding route back to terminator 310.

Turning to FIG. 4A, the cost to route from one crosspoint (crosspoint 430) on boundary 410 to a variety of crosspoints on boundary 420 is illustrated. The direct route from crosspoint 430 to each of a group of crosspoints on boundary 420 is illustrated. It will be appreciated that the actual routing from crosspoint 430 to the crosspoints on boundary 420 would likely be done with a group of horizontal and vertical segments as necessary. In most circumstances, the cost of routing from crosspoint 430 to a crosspoint of boundary 420 will rise as the position of the crosspoint moves up or down on boundary 420 away from a position corresponding to a straight horizontal line running from crosspoint 430 to boundary 420. However, it will be appreciated that the straight horizontal line routing may not always be the preferred routing. Once the cost of routing from crosspoint 430 to the crosspoints on boundary 420 is computed, routing from each of the crosspoints on boundary 420 to a further boundary or a terminator beyond boundary 420 may be calculated, including the cost of routing from crosspoint 430, or another crosspoint on boundary 410 if that crosspoint has a lower cost of routing.

Because a given boundary of an area on an integrated circuit may have 100 or more crosspoints or vertices, calculating the cost to all possible vertices becomes computationally expensive to the point of being prohibitive. An algorithm utilizing $O(n^2)$ (quadratic) or $O(n^n)$ (exponential) numbers of calculations may result. Therefore, a limitation on the crosspoints used is preferably imposed.

In one embodiment, as illustrated in FIG. 4B, each boundary begins with one valid crosspoint at each end of the boundary. Thus, boundary 410 has two crosspoints and boundary 420 has two crosspoints. The paths between the two crosspoints are illustrated, and it is apparent that the number of calculations necessary to determine costs for routing between these crosspoints is more in the range of $O(n)$ (linear). Additionally, when a terminator for a signal is within the area on one or the other side of the boundary, all crosspoints within the boundary which may be used to route directly to the terminator are created as valid crosspoints.

In one embodiment, the crosspoints created due to presence of a terminator are limited to an area one conductor-width or design-rule width less than the area of the terminator, within the area leading directly to the terminator. When a signal is routed through a crosspoint on one of the boundaries, the crosspoints on either side of where the signal crosses the boundary are created as valid crosspoints. This results in only one new crosspoint for crosspoints at the end of the boundary, and in two crosspoints for crosspoints created for a terminator other than near the end of the boundary. Still, the number of crosspoints available is roughly linear with the number of signals already routed through the boundary. This may result in something close to an $O(n)$ number of calculations if the routing costs are propagated in a reasonable manner.

In one embodiment, the cost propagation follows two rules. First, the cost of each potential crosspoint on a current boundary is propagated to the crosspoint on the next boundary that is exactly aligned (the two crosspoints are co-linear on a line parallel to the direction in which signals are being routed). Second, the cost of the K lowest-cost crosspoints on the current boundary are each propagated to all of the N crosspoints on the next boundary. K is a user-defined parameter, and experimental data has shown that K=3 yields good results. These constraints lead to $O(K*n)$ calculations, which is still a linear function of the number of crosspoints.

Turning to FIG. 5, an illustration of an obstruction is presented. Area 500 is an area in which signals may be routed on an integrated circuit. Obstruction 510 is a portion of area 500 through which no signals may be routed. The obstruction may be something such as a via or contact hole and surrounding guardband that crosses through the layer used for routing at the particular stage of the routing process, for example. When routing a signal from the left-hand side of area 500, portion 520 of area 500 may be said to be in the shadow of obstruction 510. Therefore, any crosspoint on the right-hand side of area 500 touching portion 520 may be given a higher cost for routing from the left-hand side of area 500.

In one embodiment, the presence of an obstruction such as obstruction 510 results in the creation of two crosspoints, such as crosspoints 540 and 550 that are just beyond the range of crosspoints with a higher cost of routing due to the presence of obstruction 510. Furthermore, in an alternative embodiment, the cost of routing around obstruction 510 is only increased for crosspoints such as crosspoint 530 for which a horizontal straight-line path would pass through obstruction 510.

It will be appreciated that cost accounting for each crosspoint takes into account the presence of signals (conductors or nets) which have already been routed through an area. By taking account of the previously routed signals, the cost for routing to a particular crosspoint may be adjusted to account for additional costs incurred due to L-overlap or X-overlap configurations. Thus, the cost of routing from crosspoint A2 to crosspoint A3 of FIG. 1 may be adjusted due to signal B having been routed from crosspoint B2 to crosspoint B3. As a result, the routing of signal A in FIG. 2 may be obtained instead. Similarly, the cost of routing from D2 to D3 in FIG. 1 may be adjusted to account for the potential X-overlap, thus potentially resulting in routing to a different crosspoint, or resulting in the jog introduced in the routing of FIG. 2. Likewise, the requirement that a jog in a signal be made to achieve a routing from a first crosspoint to a second crosspoint may be accounted for by increasing the cost of routing from the first to the second crosspoint.

Figure 6A:
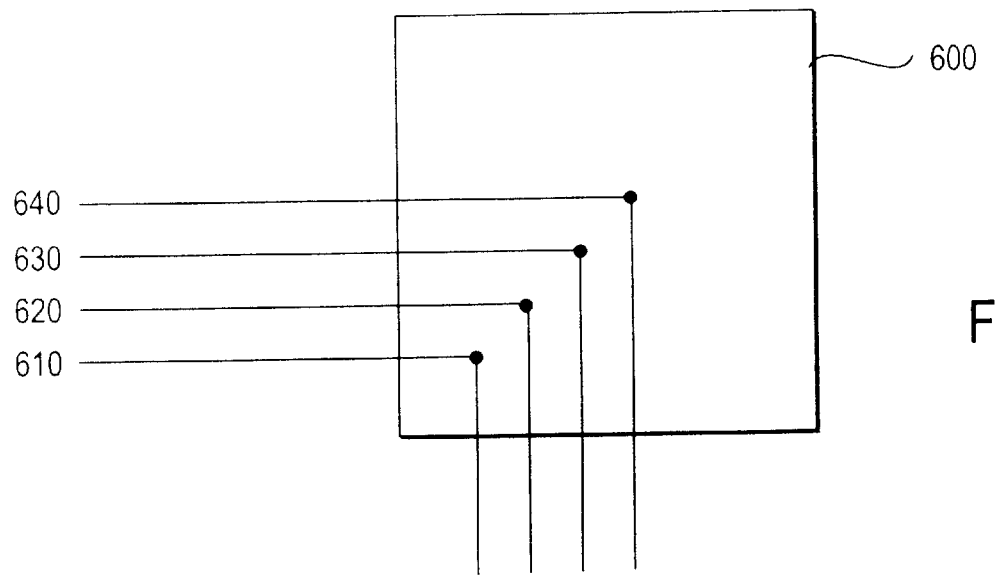
FIG. 6A illustrates a first method of routing a bus having four nets through an area.

In some instances, the lowest cost routing may not be the preferred routing for a signal. Turning to FIG. 6A, routing signal 610 through area 600 may be achieved as illustrated with a small conductor in area 600 and thus a small cost. Next, routing signal 620 through area 600 as illustrated incurs a small cost. Similarly, routing signal 630 and then signal 640 through area 600 achieves small costs for each signal relative to what is available.

Figure 6B:
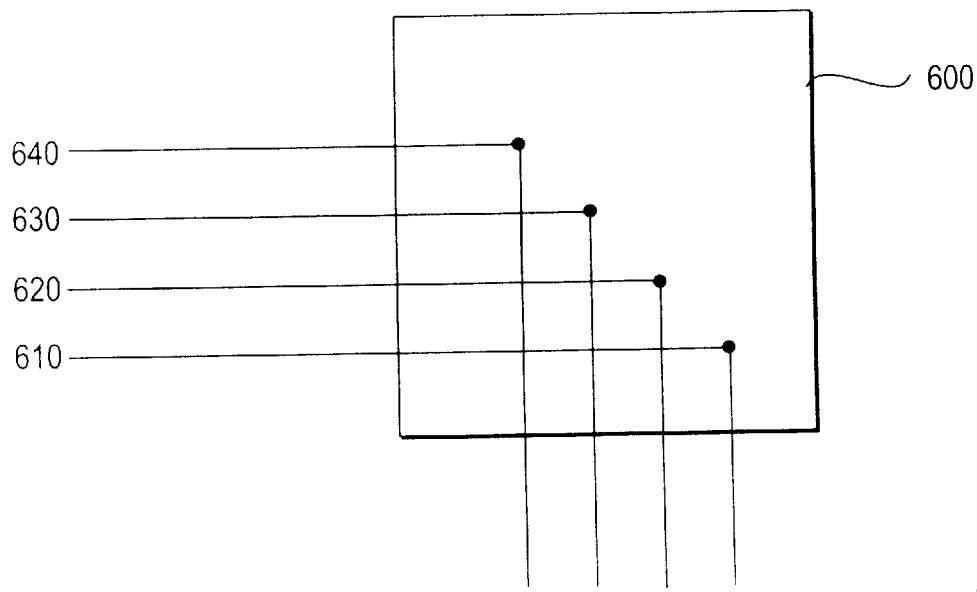
FIG. 6B illustrates a second method of routing a bus having four nets through an area.

However, the routing of signals 610, 620, 630, and 640 through area 600 as illustrated in FIG. 6B may be preferable. As an example, if signals 610, 620, 630, and 640 are intended to be bus lines that should have nearly identical electrical paths, the routing of FIG. 6B can provide a nearly identical length path for each signal. Likewise, the routing of FIG. 6B actually uses less resources within area 600, in that more of area 600 may be used by other signals.

All the same, there are some circumstances where the routing of FIG. 6A may be preferable as well. For example, if the four signals (610, 620, 630 and 640) are part of a bus that will make an 'S' shaped turn, the routing of FIG. 6A may be appropriate. Furthermore, if the conductors used in area 600 for the four signals will be used for both the horizontal and vertical legs of the signals, then the routing of FIG. 6A eliminates crossover points that would not be allowed. In either case, the individual nets or groups of nets may be designated to be routed within specific sets of rules, and the routing and costs thereof may be selected accordingly.

Figure 7:
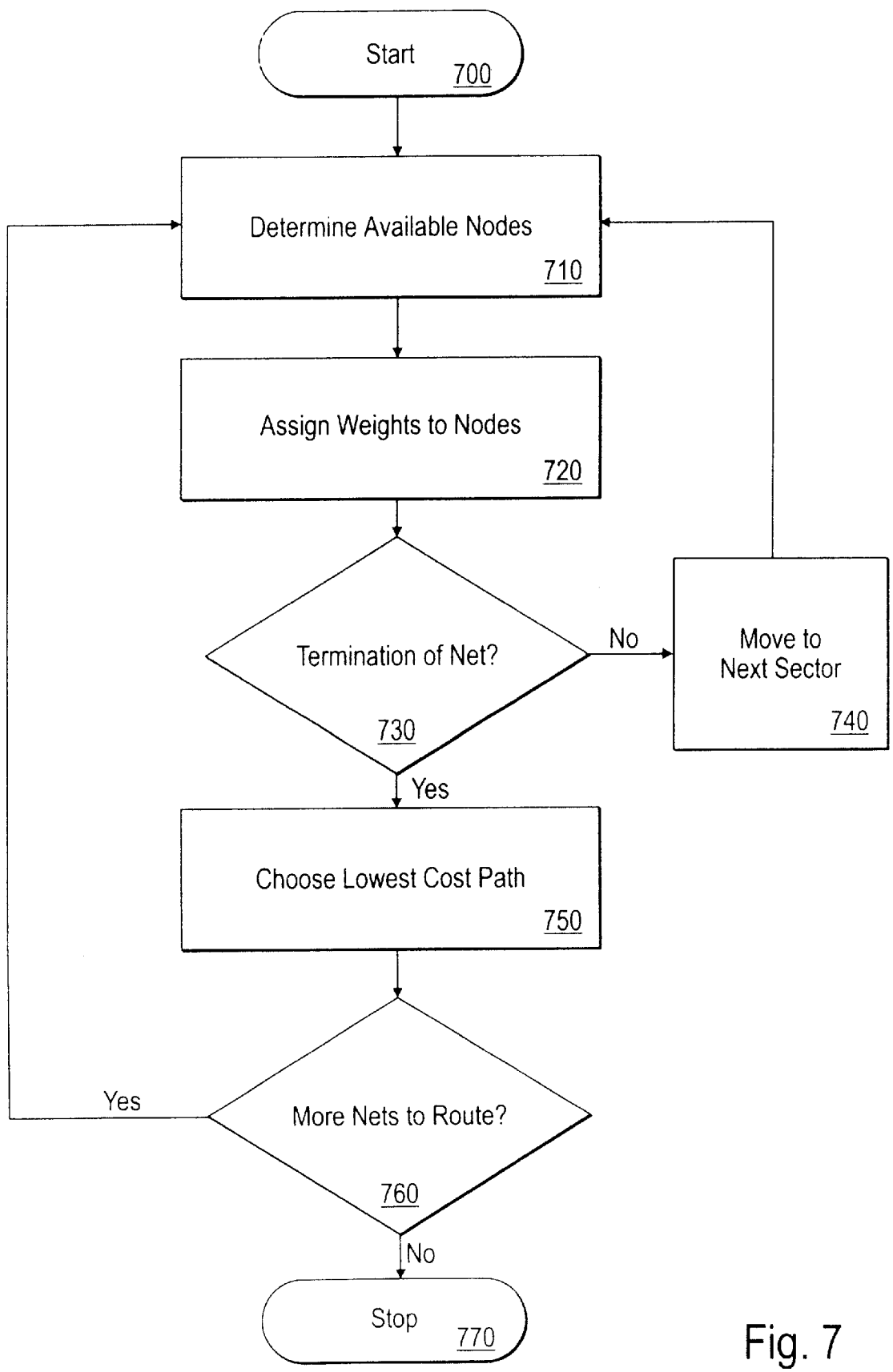
FIG. 7 illustrates a high-level flow diagram of an embodiment of a method of routing nets on a VLSI circuit.

Turning to FIG. 7, an embodiment of a process of routing nets utilizing the techniques previously described. At block 700 the process starts and the first net is selected for routing from its originating terminator. The process proceeds to block 710, where the available nodes for routing of the net or signal are found. If the signal is to be routed out of the area or sector of current concern, the nodes are the crosspoints on the appropriate boundary, whereas if the signal is to be routed to a terminator within the area of current concern, the nodes are the areas of the terminator to which the signal may be routed. The process then proceeds to block 720, where the costs to route to each node are calculated, as described with respect to avoiding obstacles, jogs, and L-overlap or X-overlap situations, along with any constraints on the routing of the signal.

The process then moves to decision block 730, where it is determined if this is the termination of the net. If not, the process moves to block 740, and the process moves to the next sector or area through which the signal should pass, before then moving to block 710. If the termination of the net is found at block 730, the process moves to block 750, and the lowest cost path within the constraints on routing the signal is chosen, backtracking along the chain of crosspoints that contributed to the lowest cost. The net is routed at this point. The process then moves to block 760, where it is determined whether there are more nets to route. If more nets need to be routed, the next net is chosen and the process moves to block 710. If all nets have been routed, the process moves to termination block 770 and ends.

It will be appreciated that the process illustrated in FIG. 7 may be applied to each appropriate portion of an integrated circuit, such as application to each area in sequence or application on a column-by-column or row-by-row basis to route all nets. Furthermore, in one embodiment, the method further orders the nets or signals to be routed based on length, and then routes the longer signals first. It will be appreciated that other ordering rules may be used. Moreover, it will be appreciated that the various routing requirements such as avoiding L-overlaps or X-overlaps or jogs may be classified as constraints having a requirement and a priority, such that a first constraint may require avoiding L-overlaps and have a high priority, a second constraint may require X-overlaps and also have a high priority, and a third constraint may require avoiding jogs and have a low priority. Likewise, individual nets may have net-specific constraints with various priorities, such as routing signals within a bus along similar paths.

Figure 8:
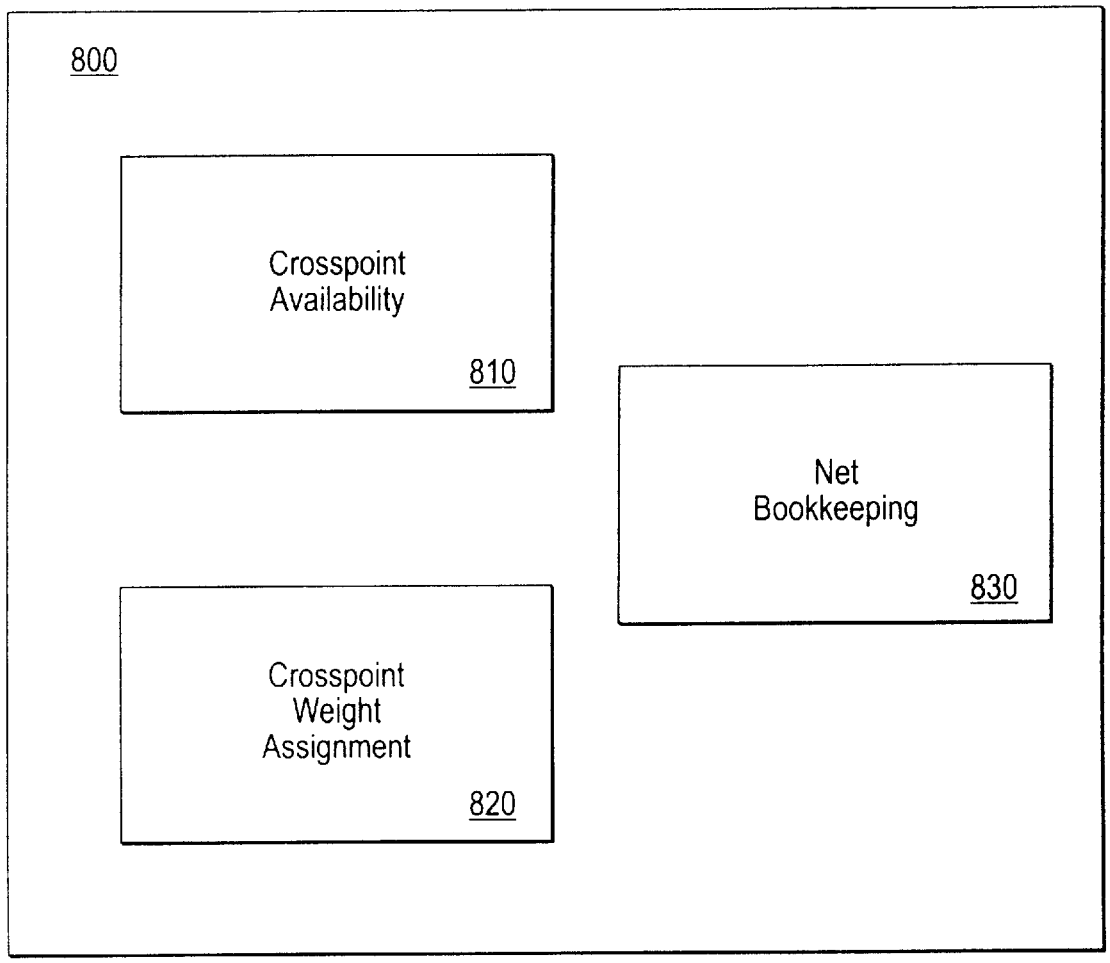
FIG. 8 illustrates an embodiment of a medium embodying an embodiment of a method of routing nets on a VLSI circuit.

Turning to FIG. 8, a medium embodying instructions for causing a processor to perform a method of accurate crosspoint allocation is illustrated. Medium 800 is a machine readable medium (or media) such as but not limited to a magnetic medium such as a disk or tape, an optical medium, a carrier wave, a memory such as a RAM or ROM, or other machine readable media. Embodied in medium 800 are instructions which may be executed by a processor. These instructions may, in one embodiment, be grouped into functional blocks. These functional blocks may include crosspoint availability checking routines 810, crosspoint cost assignment routines 820 and net bookkeeping routines 830. These functional blocks or routines may be executed by a processor to perform a method such as the method illustrated in FIG. 7 or similar methods for crosspoint allocation and routing.

In the foregoing detailed description, the method and apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A method comprising:
defining a group of contiguous areas of an integrated circuit separated by successive boundaries, each boundary having one or more nodes thereon, and routes between nodes of successive boundaries having costs, a first area including a first terminator node of a signal to be routed on the integrated circuit and a last area including a second terminator node of the signal;
selecting from a first boundary a lowest-cost node defined by a valid crosspoint of a lowest-cost route between the first terminator and the first boundary;
selecting from a successive boundary a lowest-cost node defined by a valid crosspoint of a lowest-cost route between a previous lowest-cost node and the successive boundary;
repeating the selecting from a successive boundary for each successive boundary until a successive boundary of the last area is reached;
for each preceding boundary having more than one lowest-cost node, changing, if necessary, the selected lowest-cost node to the lowest-cost node defined by a valid crosspoint of a lowest-cost route from the lowest-cost node of the successive boundary to the preceding boundary; and
identifying a signal route through the selected lowest-cost nodes.

2. The method of claim 1, wherein the cost of a route depends on a distance the route covers.

3. The method of claim 1, further comprising:
defining valid crosspoints as crosspoints on either side of where a previously routed signal crosses a boundary.

4. The method of claim 3, further comprising:
further defining, on a boundary adjacent to a terminator node, valid crosspoints as crosspoints limited to an area one design-rule width less than the area of the terminator node, within an area leading directly to the terminator node.

5. The method of claim 1, wherein the lowest-cost route is a route including a group of horizontal and vertical routing segments.

6. The method of claim 1, wherein the lowest-cost node is a terminator node.

7. The method of claim 1, further comprising:
defining valid crosspoints as crosspoints free from shadows of obstructions.

8. The method of claim 1, wherein the cost of a route between nodes of successive boundaries is increased if the route is routed around an obstruction.

9. The method of claim 1, wherein the cost of a route through a particular area is dependent on the presence of pre-routed signals that have already been routed through the same particular area.

10. The method of claim 9, wherein the cost of a route which creates a L-overlap configuration with the pre-routed signal is increased.

11. The method of claim 9, wherein the cost of a route which creates an X-overlap configuration with the pre-routed signal is increased.

12. The method of claim 1, wherein the cost of a route is dependent on the type of signal to be routed.

13. A machine-readable medium embodying instructions which, when executed by a machine, cause a processor to perform a method comprising:
defining a group of contiguous areas of an integrated circuit separated by successive boundaries, each boundary having one or more nodes thereon, and routes between nodes of successive boundaries having costs, a first area including a first terminator node of a signal to be routed on the integrated circuit and a last area including a second terminator node of the signal;

selecting from a first boundary a lowest-cost node defined by a valid crosspoint of a lowest-cost route between the first terminator and the first boundary;

selecting from a successive boundary a lowest-cost node defined by a valid crosspoint of a lowest-cost route between a previous lowest-cost node and the successive boundary;

repeating the selecting from a successive boundary for each successive boundary until a successive boundary of the last area is reached;

for each preceding boundary having more than one lowest-cost node, changing, if necessary, the selected lowest-cost node to the lowest-cost node defined by a valid crosspoint of a lowest-cost route from the lowest-cost node of the successive boundary to the preceding boundary; and identifying a signal route through the selected lowest-cost nodes.

14. The machine-readable medium of claim 13, wherein the cost of a route is dependent on a distance the route covers.

15. The machine-readable medium of claim 13 further embodying instructions which, when executed by a processor, cause the processor to perform the method further comprising:

defining valid crosspoints as crosspoints on either side of where a previously routed signal crosses a boundary.

16. The machine-readable medium of claim 15 further embodying instructions which, when executed by a processor, cause the processor to perform the method further comprising:

further defining, on a boundary adjacent to a terminator node, valid crosspoints as crosspoints limited to an area one design-rule width less than the area of the terminator node, within an area leading directly to the terminator node.

17. The machine-readable medium of claim 13, wherein the lowest-cost route is a route including a group of horizontal and vertical routing segments.

18. The machine-readable medium of claim 13, wherein the lowest-cost node is a terminator node.

19. The machine-readable medium of claim 13 further embodying instructions which, when executed by a processor, cause the processor to perform the method further comprising:

defining valid crosspoints as crosspoints free from shadows of obstructions.

20. The machine-readable medium of claim 13, wherein the cost of a route between nodes of successive boundaries is increased if the route is routed around an obstruction.

21. The machine-readable medium of claim 13, wherein the cost of a route is dependent on the presence of pre-routed signals that have already been routed through a corresponding area.

22. The machine-readable medium of claim 21, wherein the cost of a route which creates a L-overlap configuration with the pre-routed signal is increased.

23. The machine-readable medium of claim 21, wherein the cost of a route which creates an X-overlap configuration with the pre-routed signal is increased.

24. The machine-readable medium of claim 13, wherein the cost of a route is dependent on the type of signal to be routed.

25. A system comprising:

a processor;

a memory coupled with the processor;

an input device coupled with the processor; and wherein the processor to define a group of contiguous areas of an integrated circuit separated by successive boundaries, each boundary having one or more nodes thereon, and routes between nodes of different boundaries having costs, a first area including a first terminator node of a signal to be routed on the integrated circuit and a last area including a second terminator node of the signal;

the processor further to select from a first boundary a lowest-cost node defined by a valid crosspoint of a lowest-cost route between the first terminator and the first boundary;

the processor further to select from a successive boundary a lowest-cost node defined by a valid crosspoint of a lowest-cost route between a previous lowest-cost node and the successive boundary;

the processor further to repeat the selection from a successive boundary for each successive boundary until a successive boundary of the last area is reached;

the processor further to, for each preceding boundary having more than one lowest-cost node, change the selected lowest-cost node to the lowest-cost node defined by a valid crosspoint of a lowest-cost route from a successive boundary to the preceding boundary; and the processor to identify a signal route through the selected lowest-cost nodes.

26. An apparatus comprising:

means for defining a group of contiguous areas being separated by successive boundaries, each boundary having one or more nodes thereon, and routes between nodes of different boundaries having costs, a first area including a first terminator node of the signal and a last area including a second terminator node of the signal;

means for selecting from a first boundary-a lowest-cost node defined by a valid crosspoint of a lowest-cost route between the first terminator and the first boundary;

for each successive boundary, means for selecting from a successive boundary a lowest-cost node defined by a valid crosspoint of a lowest-cost route between a previous lowest-cost node and the successive boundary;

means for changing, for each preceding boundary having more than one lowest-cost node, if necessary, the selected lowest-cost node to the lowest-cost node defined by a valid crosspoint of a lowest-cost route from a successive boundary to the preceding boundary; and means for identifying a signal route through the selected lowest-cost nodes.

* * * * *